(12) United States Patent
Kuchiyama et al.

(10) Patent No.: US 10,777,709 B2
(45) Date of Patent: Sep. 15, 2020

(54) SUBSTRATE WITH TRANSPARENT ELECTRODE AND METHOD FOR PRODUCING SAME

(71) Applicant: KANEKA CORPORATION, Osaka-shi, Osaka (JP)

(72) Inventors: Takashi Kuchiyama, Settsu (JP); Hironori Hayakawa, Otsu (JP); Hiroaki Ueda, Otsu (JP); Yuji Motohara, Otsu (JP); Kenji Yamamoto, Settsu (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 0 days.

(21) Appl. No.: 16/294,100

(22) Filed: Mar. 6, 2019

(65) Prior Publication Data
US 2019/0207060 A1    Jul. 4, 2019

Related U.S. Application Data

(63) Continuation of application No. 15/114,639, filed as application No. PCT/JP2015/051286 on Jan. 19, 2015, now Pat. No. 10,270,010.

(30) Foreign Application Priority Data

Jan. 28, 2014   (JP) ................. 2014-013603

(51) Int. Cl.
| *H01L 33/42* | (2010.01) |
| *G06F 3/041* | (2006.01) |
| *C23C 14/02* | (2006.01) |
| *C23C 14/08* | (2006.01) |
| *C23C 14/58* | (2006.01) |

(Continued)

(52) U.S. Cl.
CPC ............ *H01L 33/42* (2013.01); *C23C 14/024* (2013.01); *C23C 14/083* (2013.01); *C23C 14/086* (2013.01); *C23C 14/35* (2013.01); *C23C 14/5806* (2013.01); *G06F 3/041* (2013.01); *G06F 3/044* (2013.01); *H01L 31/022425* (2013.01); *H01L 31/022466* (2013.01); *H01L 31/022483* (2013.01); *H01L 31/0392* (2013.01); *G06F 2203/04103* (2013.01); *Y02E 10/50* (2013.01)

(58) Field of Classification Search
None
See application file for complete search history.

(56) References Cited

U.S. PATENT DOCUMENTS

2012/0170170 A1* 7/2012 Gros-Jean ............. C23C 16/405
                                                                    361/313
2015/0357076 A1* 12/2015 Sasa ........................ C23C 14/34
                                                                    428/216

* cited by examiner

*Primary Examiner* — William D Young
(74) *Attorney, Agent, or Firm* — Alleman Hall Creasman & Tuttle LLP

(57) ABSTRACT

Provided is a substrate with transparent electrode, which is capable of achieving both acceleration of crystallization dining a heat treatment and suppression of crystallization under a normal temperature environment. In the substrate with transparent electrode, a transparent electrode thin-film formed of a transparent conductive oxide is formed on a film substrate. An underlayer that contains a metal oxide as a main component is formed between the film substrate and the transparent electrode thin-film. The underlayer and the transparent electrode thin-film are in contact with each other. The transparent electrode thin-film is amorphous, and the base layer is dielectric and crystalline.

10 Claims, 4 Drawing Sheets

(51) Int. Cl.
*G06F 3/044* (2006.01)
*H01L 31/0224* (2006.01)
*H01L 31/0392* (2006.01)
*C23C 14/35* (2006.01)

| | current image | shape image |
|---|---|---|
| 1 nm |  |  |
| 3 nm |  |  |
| 6 nm |  |  |
| 10 nm |  |  |
| 15 nm |  |  |
| 20 nm |  |  |

| | current image | shape image |
|---|---|---|
| 1 nm |  |  |
| 3 nm |  |  |
| 6 nm |  |  |
| 10 nm |  |  |
| 15 nm |  |  |
| 20 nm |  |  |

SUBSTRATE WITH TRANSPARENT ELECTRODE AND METHOD FOR PRODUCING SAME

CROSS REFERENCE TO RELATED APPLICATIONS

This application is a continuation of U.S. patent application Ser. No. 15/114,639, entitled SUBSTRATE WITH TRANSPARENT ELECTRODE AND METHOD FOR PRODUCING SAME, filed Jul. 27, 2016, which is the U.S. National Phase of International Patent Application No. PCT/JP2015/051286, entitled SUBSTRATE WITH TRANSPARENT ELECTRODE AND METHOD FOR PRODUCING SAME, filed Jan. 19, 2015, which in turn claims priority to Japanese Patent Application No. JP2014-013603, filed Jan. 28, 2014. Each of these applications is hereby incorporated by reference in its entirety for all purposes.

TECHNICAL FIELD

The invention relates to a substrate with transparent electrode in which a transparent electrode thin-film is formed on a film substrate, and a production method thereof.

In substrates with transparent electrode which are used in display devices such as touch panels and displays, light-emitting devices such as LEDs, and light-receiving devices such as solar cells, control of electrical property so called sheet resistance is important. Particularly, techniques for reducing the resistance of a transparent electrode thin-film by heat-treating the transparent electrode thin-film to accelerate crystallization are important, and conventional research and development is mostly aimed at pursuing acceleration of crystallization to achieve reduction of resistance.

A substrate with transparent electrode with a structure in which a transparent electrode thin-film is formed on a flexible substrate such as a film is well known. One with an underlayer formed between a film and a transparent electrode thin-film is also known. For example, Patent Document 1 describes a technique in which cerium oxide is deposited as an underlayer to reduce the resistance of a transparent electrode thin-film. Patent Document 2 describes a technique in which a transparent electrode thin-film is made to have a multi-layer structure to accelerate crystallization. Patent Document 3 describes a technique in which a dielectric layer and a conductive layer are stacked on a substrate to control electrical properties and abrasion resistance.

Patent Document 4 describes a method for producing a transparent conductive film which can be crystallized at room temperature or a low temperature and thus high temperature heat treatment is required for crystallization.

PRIOR ART DOCUMENTS

Patent Documents

Patent Document 1: Japanese Patent Laid-open Publication No. 7-178863
Patent Document 2: Japanese Patent Laid-open Publication No. 2012-114070
Patent Document 3: National Publication of International Patent Application No. 3-504900
Patent Document 4: International Publication No. WO 2013/111681

SUMMARY OF THE INVENTION

Problems to be Solved by the Invention

Patent Document 4 describes that when a substrate with transparent electrode is stored under a normal-temperature environment for a long period of time, electrical properties may be changed. This is a phenomenon in which an amorphous transparent electrode thin-film is converted into a crystalline film which is thermodynamically stable under a nominal-temperature environment, so that electrical properties are changed. When the film is crystallized under a normal-temperature environment as described above, internal stress occurs in the transparent electrode thin-film, and the film may be peeled from the substrate, or deformed in a subsequent device fabrication process. Particularly, when the substrate is a soft material such as a film or plastic, the above-mentioned problem easily occurs. The "acceleration of crystallization in heat treatment" and "suppression of crystallization under a normal-temperature environment" are mutually contradictory properties, but both of these properties may be required in high-performance products.

In view of the above-mentioned problems, an object of the present invention is to provide a substrate with transparent electrode which has both of two properties: acceleration of crystallization in heat treatment and suppression of crystallization under a normal-temperature environment.

Means for Solving the Problems

The present inventors have extensively conducted studies, and resultantly found that both the two properties can be obtained by forming a specific underlayer on a film substrate, and then forming an amorphous transparent electrode thin-film.

The present invention relates to a substrate with transparent electrode in which a transparent electrode thin-film is formed on a film substrate. The underlayer is in contact with the transparent electrode thin-film. The transparent electrode thin-film is amorphous, and the underlayer is dielectric and crystalline. Preferably, an underlayer containing as a main component a metal oxide such as indium oxide, zinc oxide or yttrium oxide is formed between the film substrate and the transparent electrode thin-film.

The thickness of the underlayer is preferably 2 to 15 nm for suppressing diffusion of a crystallization inhibiting component of the transparent electrode thin-film from the base, or controlling surface free energy in formation of the transparent electrode thin-film.

Preferably, the transparent electrode thin-film contains indium oxide as a main component. The thickness of the transparent electrode thin-film is preferably 15 to 30 nm from the viewpoint of low resistance and high transparency.

As a more preferred aspect, the transparent electrode thin-film includes low-resistance gains, and the diameter of the low-resistance gains as determined by current image measurement using an atomic force microscope shows the maximum at interior of the transparent electrode thin-film. Further preferably, the diameter of the low-resistance grains shows maximum at the central part of the transparent electrode thin-film.

The present invention relates to a method for producing the substrate with transparent electrode. The underlayer and the transparent electrode thin-film are each deposited by a magnetron sputtering method using an oxygen gas, and the amount of oxygen introduced into a chamber in deposition of the underlayer is three or more times of the amount of oxygen introduced into a chamber in deposition of the transparent electrode thin-film.

Effects of the Invention

According to the present invention, the crystallinity and electrical properties of the transparent electrode thin-film can be controlled by controlling the material and structure of the underlayer. As a result, not only crystallization in heat treatment can be accelerated, but also crystallization under a normal-temperature environment can be suppressed, so that a substrate with transparent electrode having stable quality can be provided.

DESCRIPTION OF EMBODIMENT

Figure 1:
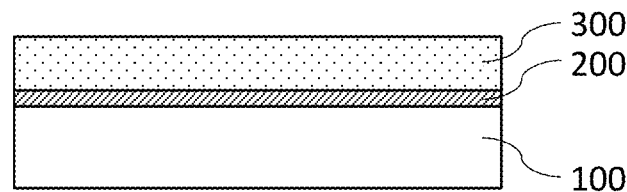
FIG. 1 is a schematic sectional view showing one example (Example A1) of a substrate with transparent electrode according to the present invention.

Hereinafter, preferred embodiments of the present invention will be described with reference to the drawings. Dimensional relationships as to thickness and so on are appropriately changed for clarification and simplification of the drawings, and actual dimensional relationships are not shown. In the drawings, same reference characters represent same or similar technical items.

[Substrate with Transparent Electrode]

Figure 2:
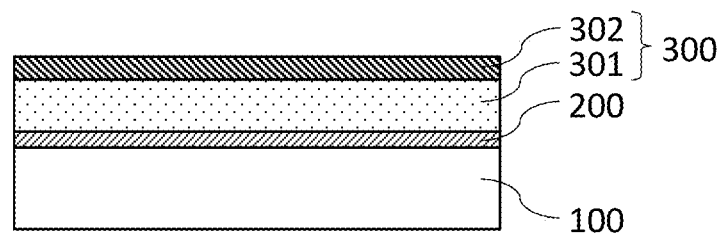
FIG. 2 is a schematic sectional view showing one example (Example A5) of a substrate with transparent electrode according to the present invention.
Figure 3:
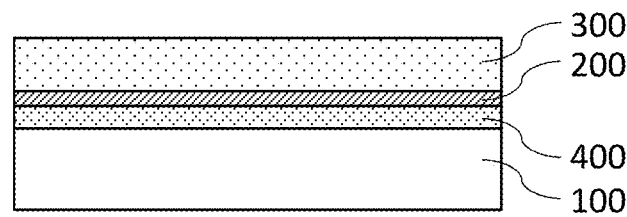
FIG. 3 is a schematic sectional view showing one example (Example A4) of a substrate with transparent electrode according to the present invention.

FIG. 1 shows a substrate with transparent electrode in which an underlayer 200 is formed on a film substrate (hereinafter, also referred to as a transparent film base) 100, and a transparent electrode thin-film 300 is formed on the underlayer 200. The underlayer 200 is in contact with the transparent electrode thin-film 300. The transparent electrode thin-film 300 may be configured to have a plurality of layers such as layers 301 and 302 as shown in FIG. 2. A coating layer 400 may be provided between the transparent film base 100 and the underlayer 200 as shown in FIG. 3. The coating layer 400 is provided for protection of the transparent film base 100, suppression of diffusion of low-molecular-weight components contained in the transparent film base 100, adjustment of optical thickness, and so on. Although the coating layer 400 is formed on only one surface of the transparent film base 100 in FIG. 3, the coating layer may be formed on both surfaces of the transparent film base.

The transparent film that forms the transparent film base 100 is preferably colorless and transparent in at least a visible region.

In one embodiment, the underlayer 200 contains indium oxide as a main component, and is dielectric and crystalline. The underlayer 200 may contain as a main component a metal oxide such as Zinc oxide or yttrium oxide. In this specification, the phrase "contains a substance as a main component" means that the content of the substance is 51% by weight or more, preferably 70% by weight or more, more preferably 90% by weight or more. Each layer may, contain components other than the main component as long as the feature of the present invention is not impaired.

The content of indium oxide, zinc oxide or yttrium oxide in the underlayer 200 is preferably 87.5% by weight to 99.0% by weight, more preferably 90% by weight to 95% by weight.

The underlayer 200 may contain a doped impurity. The doped impurity is preferably tin oxide, zinc oxide, titanium oxide or tungsten oxide. The underlayer includes indium tin oxide (ITO) when the doped impurity is tin oxide, and the underlayer includes indium zinc oxide (IZO) when the doped impurity is zinc oxide. Here, the content of the doped impurity in the underlayer 200 is preferably 4.5% by weight to 12.5% by weight, more preferably 5% by weight to 10% by weight.

Indium oxide, zinc oxide or yttrium oxide that forms the underlayer 200 is preferable for controlling the surface free energy of the underlayer 200 to a value most suitable for formation of the transparent electrode thin-film 300, and for securing barrier properties to protect the film against chemical factors such as water vapor and physical factors such as plasma. Further, such an oxide is preferable because it does not contain carbon and nitrogen atoms that may inhibit crystallization of the transparent electrode thin-film 300. Moreover, indium oxide, zinc oxide or yttrium oxide that forms the underlayer 200 is capable of suppressing crystallization of the transparent electrode thin-film 300 under a normal-temperature environment unlike underlayer materials such as silicon oxide. This may be effective for controlling activation energy in crystallization of the transparent electrode thin-film 300. Further, the above-mentioned material is preferable because lattice matching with the transparent electrode thin-film 300 is improved.

Preferably, the underlayer 200 is formed by a sputtering method as described later. When an underlayer is formed by a sputtering method using silicon which is strongly bonded to oxygen, the film may be easily oversaturated with oxygen, and therefore crystallization of the transparent electrode thin-film 300 formed thereon may be excessively accelerated, leading to progress of crystallization at normal temperature. Accordingly, it is preferable that the underlayer is substantially free of silicon oxide. Similarly it is preferable that the underlayer is substantially free of cerium oxide. In this specification, the phrase "substantially free of a substance" means that the content of the substance is less than 1% by weight, preferably less than 0.1% by weight, especially preferably 0% by weight.

The thickness of the underlayer 200 is preferably 2 to 15 nm, more preferably 2 to 10 nm, further preferably 2 to 5 nm, especially preferably 2.5 to 4 nm. The underlayer 200 has functions of suppressing diffusion of components which inhibit crystallization of the transparent electrode thin-film 300, such as carbon atoms and nitrogen atoms from the transparent film base 100, protecting, the transparent film base 100 from plasma in formation of the transparent electrode thin-film 300 by a sputtering method, controlling surface free energy in formation of the transparent electrode thin-film 300, and so on. For performing these functions, the thickness of the underlayer 200 is preferably in the above-mentioned range. Particularly, when the underlayer 200 has a small thickness of 2 to 5 nm (preferably 2.5 to 4 nm), the underlayer is easily made dielectric and crystalline, so that the effect of accelerating crystallization in heat treatment and suppressing crystallization under a normal-temperature environment can be satisfactorily obtained.

In this specification, dielectric means that the resistivity is $1 \times 10^2$ Ωcm or more. When the underlayer is conductive, mutual transfer of free electrons between the underlayer and the transparent electrode thin-film occurs to cause an electron-lattice interaction, which may accelerate crystallization, leading to progress of crystallization at normal temperature.

In this specification, the crystalline material is defined as a material which can be confirmed to contain an order of atomic arrangement by observation of a lattice image with a transmission electron microscope (TEM) among materials in which crystal grains etc. can be confirmed to be crystalline. Although a crystalline material preferably contains an order of atomic arrangement with a distance of 5 nm or more, it may contain an order of atomic arrangement with a distance of 3 nm or more or 4 nm or more. On the other hand, a material in winch crystalline grains etc. cannot be confirmed to be crystalline is amorphous. Even if an existence of crystalline grains etc. can be continued, a material winch does not contain an order of atomic arrangement is defined as amorphous. The same applies to whether the transparent electrode thin-film is crystalline or amorphous. In observation of a cross-section with a TEM, a crystalline material and an amorphous material can be discriminated by an image contrast.

When the underlayer (hereinafter also referred to as a dielectric under layer) 200 is crystalline, not only surface free energy and barrier properties can be controlled, but also crystal nuclei can be formed in the thickness direction of the transparent electrode thin-film 300 from the interface between the underlayer 200 and the transparent electrode thin-film 300 in deposition of the transparent electrode thin-film 300 by sputtering. Thus formed crystal nuclei can accelerate crystallization in heat treatment.

In evaluation of the resistivity and crystallinity of the underlayer, the evaluation may be performed after only the underlayer is deposited, or the evaluation may be performed after the transparent electrode thin-film is etched and removed. When the transparent electrode thin-film and the underlayer are made of different materials, the properties are easily evaluated from the surface of the underlayer by etching and removing the transparent electrode thin-film. When the underlayer and the transparent electrode thin-film are made of the same material, the properties can be evaluated with the surface of the underlayer being identified by measuring the etching rate with consideration given to the fact that there is a difference in crystallinity at the interface between the underlayer and the transparent electrode thin-film.

The transparent electrode thin-film 300 is amorphous. Preferably, the transparent electrode thin-film 300 is formed of a transparent conductive oxide, and contains indium oxide as a main component. The content of indium oxide in the transparent electrode thin-film 300 is preferably 87.5% by weight to 99.0% by weight, more preferably 90% by weight to 95% by weight. Preferably, the transparent electrode thin-film 300 contains a doped impurity for imparting conductivity by giving a carrier density in the film. The doped impurity is preferably tin oxide, zinc oxide, titanium oxide or tungsten oxide. The transparent electrode thin-film includes indium tin oxide (ITO) when the doped impurity is tin oxide, and the transparent electrode thin-film includes indium zinc oxide (IZO) when the doped impurity is zinc oxide. The content of the doped impurity in the transparent electrode thin-film 300 is preferably 4.5% by weight to 12.5% by weight, more preferably 5% by weight to 10% by weight.

The thickness of the transparent electrode thin-film 300 is preferably 15 nm to 30 nm, more preferably 17 nm to 27 nm, further preferably 20 nm to 25 nm, so that the transparent electrode thin-film 300 has a low resistance and a high transmittance.

The total thickness of the transparent electrode thin-film 300 and the underlayer 200 is preferably less than 50 nm, more preferably 10 nm to 45 nm, especially preferably 20 nm to 30 nm.

Preferably, the transparent electrode thin-film 300 includes low-resistance grains. The low-resistance grains are preferably gains of a transparent conductive oxide that forms the transparent electrode thin-film 300. When the transparent electrode thin-film 300 is formed on the underlayer 200, crystal nuclei can be formed in the thickness direction of the transparent electrode thin-film from the interface between the underlayer 200 and the transparent electrode thin-film 300 as described above. Preferably, the diameter of the low-resistance gains shows the maximum value at interior of the transparent electrode thin-film when the transparent electrode thin-film is observed in a current image measurement mode with an atomic force microscope (AFM).

Figure 4:
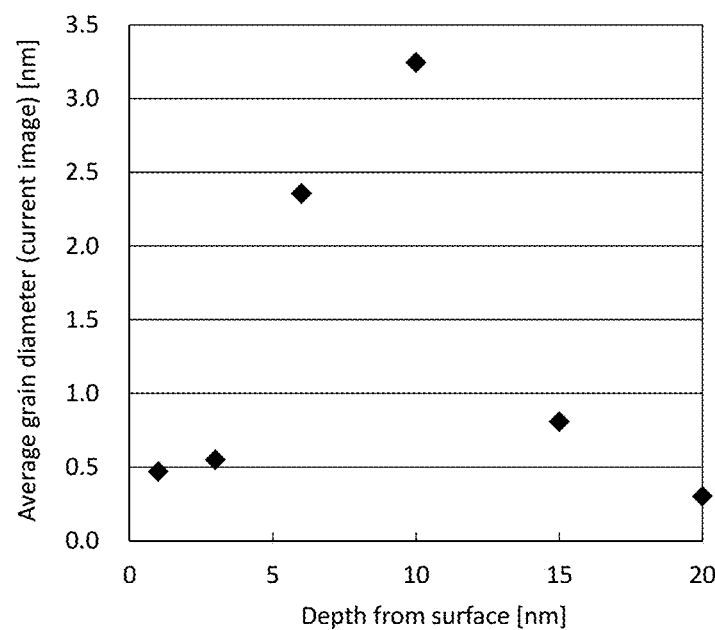
FIG. 4 shows an average grain diameter of low-resistance grains (as calculated in a current image) in the thickness direction of the transparent electrode thin-film in Example A2.
Figure 5:
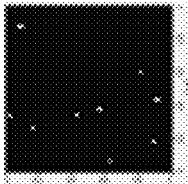
FIG. 5 shows an atomic force microscope image (shape image/current image) in the thickness direction in Example A2.
Figure 5:
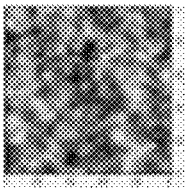
Figure 5:
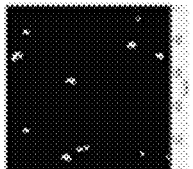
Figure 5:
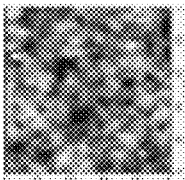
Figure 5:
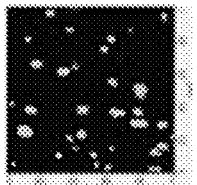
Figure 5:
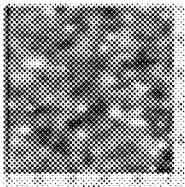
Figure 5:
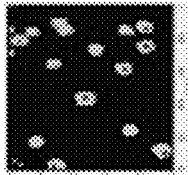
Figure 5:
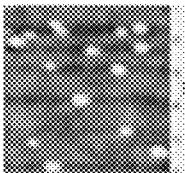
Figure 5:
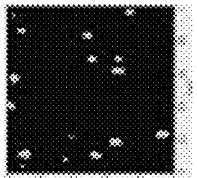
Figure 5:
Figure 5:
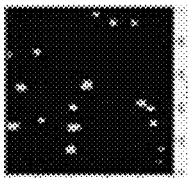
Figure 5:
Figure 6:
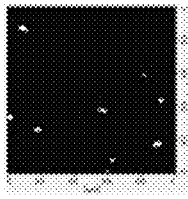
FIG. 6 shows an atomic force microscope image (shape image/current image) in the thickness direction in Example A1.
Figure 6:
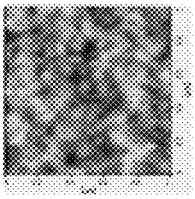
Figure 6:
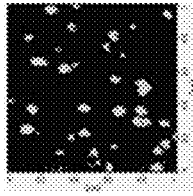
Figure 6:
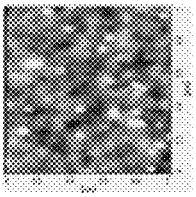
Figure 6:
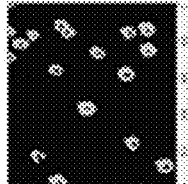
Figure 6:
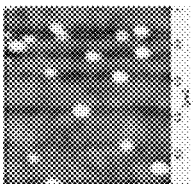
Figure 6:
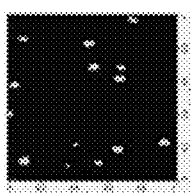
Figure 6:
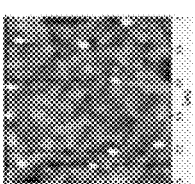
Figure 6:
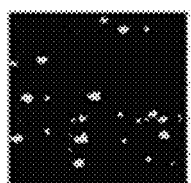
Figure 6:
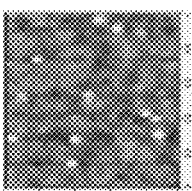
Figure 6:
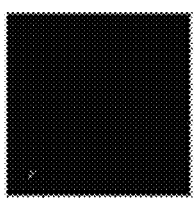
Figure 6:
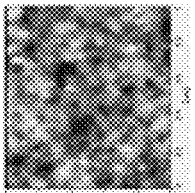

In this specification, the phrase "interior of the transparent electrode thin-film" means a part other than the outermost surface and the lowermost surface of the transparent electrode thin-film in the thickness direction. FIG. 4 shows a profile of the average grain diameter of a low-resistance gain in the thickness direction of the transparent electrode thin-film. The abscissa represents the depth in the transparent electrode thin-film, the depth of 0 nm corresponds to the surface of the transparent electrode thin-film 300, and the depth of 20 nm corresponds to a part immediately above the interface between the transparent electrode thin-film 300 and the dielectric underlayer 200. The current images in FIG. 5 and FIG. 6 are obtained by scanning a surface with an application of a constant bias using a conductive cantilever and mapping a current value. Since low-resistance gains are observed as high-current regions (white regions of current images in FIG. 5 and FIG. 6), the current image is subjected to binarization processing to identify a low-resistance gain, and from the area S of the grain, the gain diameter r can be measured based on the relationship of $S=\pi r^2$. An average grain diameter is determined from the average of the grain diameters r of all low-resistance grains in the current image. A profile of the average gain diameter of low-resistance grains in the thickness direction is determined by performing measurement while etching the transparent electrode thin-film in order from the surface (0 nm) to a part immediately above the interface with the underlayer (20 nm). From FIG. 4, it is understood that the crystal grain diameter shows the maximum value at interior of the transparent electrode thin-film, particularly at the central part (about 10 nm in FIG. 4) of the transparent electrode thin-film.

[Method for Producing Substrate with Transparent Electrode]

Hereinafter, the present invention will be further described along a method for producing a substrate with transparent electrode. In method for producing a substrate with transparent electrode, the transparent film base 100 is used (base providing step). The dielectric underlayer 200 is formed on the transparent film base 100 (underlayer forming step), and the transparent electrode thin-film 300 is then formed on the dielectric underlayer 200 (transparent electrode thin-film forming step).

(Base Providing Step)

The material of the transparent film that forms the transparent film base 100 is not particularly limited as long as it is colorless and transparent in at least a visible region, and has heat resistance at a temperate at which the transparent electrode thin-film is formed. Examples of the material of the transparent film include polyester-based resins such as polyethylene terephthalate (PET), polybutylene terephthalate (PBT) and polyethylene naphthalate (PEN), cycloolefin-based resins, polycarbonate resins, polyimide resins and cellulose-based resins. Among them, polyester-based resins are preferable, and polyethylene terephthalate is particularly preferably used.

Although the thickness of the transparent film base 100 is not particularly limited, it is preferably 10 μm to 400 μm, more preferably 20 μm to 200 μm. When the thickness is in the above-mentioned range, the transparent film base 100 may have durability and moderate flexibility, and therefore the dielectric underlayer 200 and the transparent electrode thin-film 300 can be deposited on the transparent film base 100 with high productivity by a roll-to-roll method. As the transparent film base 100, one in which molecules are oriented by biaxial stretching to improve mechanical properties such as a Young's modulus and heat resistance is preferably used.

Generally, a stretched film is thermally shrinkable when heated because strain resulting from stretching remains in the molecular chain. Low-thermal-shrinkage film is known as a biaxially-stretched film in which the thermal shrinkage ratio is reduced to about 0.2% or less, and the thermal shrinkage initiation temperature is increased. In this biaxially-stretched film, stretching conditions are adjusted and heating after stretching is carried out to reduce the thermal shrinkage. Use of such a low-thermal-shrinkage film as a base has been proposed for suppressing failures resulting from thermal shrinkage of the base in a process for production of a substrate with transparent electrode.

The coating layer (functional layer) 400 such as a hard coat layer may be formed on one or both of the surfaces of the transparent film base 100. For the transparent film base to have moderate durability and flexibility, the thickness of the coating layer is preferably 1 to 10 μm, more preferably 3 to 8 μm, further preferably 5 to 8 μm. The material of the coating layer is not particularly limited, and a material obtained by applying and curing a urethane-based resin, an acryl-based resin, a silicone-based resin or the like can be appropriately used.

(Underlayer Forming Step)

The method for forming the dielectric underlayer 200 is preferably a sputtering method from the viewpoint of productivity and a magnetron sputtering method is particularly preferable. Sputtering deposition is carried out with introducing a carder gas including an inert gas such as argon or nitrogen and an oxygen into a deposition chamber. The gas to be introduced is preferably a mixed gas of argon and oxygen. A gas of argon and oxygen at a predetermined mixing ratio may be provided beforehand, or an argon gas and an oxygen gas may be mixed after the flow rate of each of the gases is controlled by a flow rate controller (mas flow controller). The mixed gas may include other gases as long as the feature of the present invention is not impaired. The pressure (total pressure) in the deposition chamber is preferably 0.1 Pa to 1.0 Pa, more preferably 0.15 Pa to 0.8 Pa.

Generally, in a sputtering method, it is not easy to form a dielectric indium oxide thin-film. This is because a deposited film is selectively sputtered by an active gas plasma to cause oxygen deficiency (i.e., stoichiometry is not obtained), even when an active gas such as oxygen is introduced into a sputtering atmosphere for the purpose of obtaining an indium oxide with a stoichiometric composition by reactive sputtering. Accordingly, the film is likely made amorphous and conductive. Even when an oxide target with a stoichiometric composition (in a completely oxidized state) is used, conductivity is generally retained due to influences of active ions. On the other hand, the characteristic properties of the present invention are in that the underlayer has no conductivity, and is crystalline.

In formation of the underlayer 200, the intensity of a magnet in magnetron sputtering is preferably 700 to 1300 gausses. Accordingly, a utilization efficiency reduction of a sputtering target due to extreme erosion can be suppressed and the underlayer 200 with high quality can be formed. This is because the discharge voltage can be decreased by increasing the magnetic field intensity, and there is the advantage that the underlayer 200 can be formed while damage to the transparent film base 100 is kept low. The power supply that is used for sputtering is not limited, a DC power supply, an AC power supply or the like can be selected according to a target material. Although preferable discharge voltage depends on the types of an apparatus and a power supply it is preferable about −100 to −350 V, more preferably about −180 to −300 V for forming the satisfactory underlayer 200.

Preferably, the underlayer 200 is deposited while damage to the substrate is kept as low as possible. Damage to the substrate can be reduced by a method such as deposition at a low power density instead of low-voltage deposition using a strong-magnetic-field cathode as described above.

The amount of oxygen introduced into a sputtering chamber is a key factor in formation of the dielectric underlayer 200. The above-mentioned dielectric underlayer can be formed by depositing the layer while introducing oxygen in an amount three or more times of the amount of oxygen that is introduced in formation of usual transparent conductive indium oxide (so called a bottom oxygen amount). Dielectric indium oxide can be formed by carrying out sputtering deposition under the introduction of an excessive amount of oxygen. This is considered to be because the carrier density is reduced to prevent the conductive carriers from being conduction and an increase in barrier at crystal gain boundaries degrades the mobility extremely. The amount of oxygen that is introduced in deposition of the dielectric underlayer is preferably three to eight times of the bottom oxygen amount. An excessively large amount of oxygen may cause a reduction in deposition rate and damage to a thin-film by oxygen plasma.

The oxygen partial pressure in the deposition chamber in formation of the dielectric underlay 200 is preferably $1 \times 10^{-2}$ Pa to $4 \times 10^{-1}$ Pa, more preferably $2.5 \times 10^{-2}$ Pa to $2.0 \times 10^{-1}$ Pa.

The thickness of the underlayer 200 may also affect formation of a dielectric material. The underlayer 200 is easily made dielectric by thinning, the underlayer 200, and particularly when the thickness of the underlayer 200 is 2 to 5 nm (preferably 2.5 to 4 nm), the underlayer 200 having a desired resistivity can be satisfactorily formed.

Although the power in formation of the dielectric underlayer 200 is not particularly limited, it is preferably 1 to 5 kW, more preferably 2 to 4 kW. By adjusting deposition conditions such as the amount of oxygen, power and pressure in formation of the underlayer 200, the underlayer 200 can be made not only dielectric but also crystalline.

(Transparent Electrode Thin-Film Forming Step)

The method for forming the transparent electrode thin-film 300 is preferably a sputtering method from the viewpoint of productivity, and a magnetron sputtering method is particularly preferable.

The oxygen partial pressure in the deposition chamber in formation of the transparent electrode thin-film 300 is preferably $1\times10^{-3}$ Pa to $5\times10^{-2}$ Pa, more preferably $3.0\times10^{-3}$ Pa to $4.0\times10^{-2}$ Pa. The above-mentioned oxygen partial pressure range is below the oxygen partial pressure. In general ITO deposition by a sputtering method. Thus, the transparent electrode thin-film is deposited under the condition of a small oxygen introduction amount. Accordingly, there may be many oxygen deficiencies in the amorphous transparent electrode thin-film after deposition.

In formation of the transparent electrode thin-film 300 by a sputtering method, whole of a desired thickness may be formed in single time deposition. It is preferable to form the transparent electrode thin-film 300 in a plurality of times of deposition from the viewpoint of a production processing speed and a thermal history in the transparent film base 100. When the transparent electrode thin-film is formed in a plurality of times of deposition, crystallinity can be controlled by the following two methods. First method is employing different deposition conditions for each layer while targets having the same composition are used, and the second one is using targets having different compositions are used. In the former method, for example, when the transparent electrode thin-film is deposited on the dielectric underlayer 200, formation of crystal nuclei can be promoted by setting the applied power to be high, or activation energy for crystallization can be increased by setting the applied voltage to be low. Further, by adjusting the applied power and the reactive gas (oxygen etc.) partial pressure in deposition of the outermost surface, dopants contained in the transparent electrode thin-film can be inhibited from being unevenly distributed to the surface of the transparent electrode thin-film 300, so that uniform crystallization can occur in the transparent electrode thin-film. The latter method is forming the transparent electrode thin-film with sequentially changing the compositions and concentrations of materials and dopants that form the transparent electrode thin-film. In this method, it is preferable that the materials of dopants are the same and the concentration thereof is changed only in the thickness directory, from the view point of smooth transportation of electrons in the transparent electrode thin-film.

The power in formation of the transparent electrode thin-film 300 is not particularly limited, but it is preferably 9 to 15 kW, more preferably 10 to 13 kW. In formation of the transparent electrode thin-film 300 having a plurality of layers, the power in formation of a transparent electrode thin-film on the underlayer 200 side (layer 301 in FIG. 2) is preferably 9 to 15 kW, more preferably 10 to 13 kW, and the power in formation of a transparent electrode thin-film on the surface side (layer 302 in FIG. 2) is preferably 1 to 5 kW, more preferably 2 to 4 kW.

The substrate temperature in deposition of the underlayer and the transparent electrode thin-film may be a temperature at which the transparent film base has heat resistance, and this temperature is preferably 60° C. or lower. The substrate temperature is more preferably −20° C. to 40° C. When the substrate temperature is 60° C. or lower, volatilization of moisture and organic substances (e.g., oligomer components) from the transparent film base, etc. is suppressed to enhance the crystallization of indium oxide, and an increase in resistivity of the crystalline transparent electrode thin-film after crystallization of the amorphous film can be suppressed. When the substrate temperature is in the above-mentioned range, a reduction in transmittance of the transparent electrode thin-film and embrittlement of the transparent film base are suppressed, and the film base does not suffer a significant dimensional change in the deposition step.

In the present invention, it is preferable that the underlayer and the transparent electrode thin-film are deposited by a roll-to-roll method using a roll-to-roll sputtering apparatus. By carrying out deposition by a roll-to-roll method, a roll-shaped wound body of a long sheet of a transparent film base with an amorphous transparent electrode thin-film formed thereon is obtained. The dielectric underlayer 200 and the transparent electrode thin-film 300 may be continuously deposited on the transparent film base 100 using a roll-to-roll sputtering apparatus.

It is preferable that in the atmosphere in the vacuum chamber in sputtering deposition, the partial pressure of components having m (mass)/z (charge)=18 is $2.8\times10^{-4}$ Pa or less, and the partial pressure of components having m (mass)/z (charge)=28 is $7.0\times10^{-4}$ Pa or less. The m (mass)/z (charge) is measured by a quadruple mass spectrometer. The components having m/z=18 mainly include water, and the components having m/z=28 mainly include components derived from organic substances, and nitrogen. When these partial pressures each fill within the above-mentioned range, ingress of crystallization inhibiting substances into the transparent electrode thin-film can be suppressed. For obtaining the above-mentioned atmosphere, a method is generally used in which the inside of the sputtering apparatus, or the film roll before introduction thereof into the apparatus is subjected to a degassing treatment. For example, moisture can be removed by heating. In addition, by forming the dielectric underlayer according to the present invention, diffusion of the above-mentioned components from the film in formation of the transparent electrode can be suppressed, and diffusion of the components can also be suppressed after deposition.

A substrate with transparent electrode can be produced through the steps described above. The substrate with transparent electrode may be subjected to a crystallization step (crystallization step). By crystallizing the amorphous transparent electrode thin-film 300, a low-resistance transparent electrode thin-film is obtained.

(Crystallization Step)

Preferably, the substrate with trans rent electrode is heated to 120 to 170° C. in the crystallization step.

Preferably, crystallization is performed under an oxygen-containing atmosphere, such as in the air, for sufficiently capturing oxygen into the film to shorten the time for crystallization. Although crystallization may progress in vacuum or under an inert gas atmosphere, it tends to take more time for crystallization under a low-oxygen-concentration atmosphere than under an oxygen atmosphere.

When a roll-shaped wound body of a long sheet is subjected to the crystallization step, crystallization may be performed with the film kept in the form of a wound body, or crystallization may be performed while the film is conveyed in a roll-to-roll manner, or crystallization may be performed with the film cut to a predetermined size.

When crystallization is performed with the film kept in the form of a wound body, the base after formation of the transparent electrode thin-film may be aged (left standing) in a heating chamber etc. When crystallization is performed in a roll-to-roll manner, the base is introduced into a heating furnace and heated while being conveyed, and is then rewound into a roll-shaped body.

The crystallinity degree of the transparent electrode thin-film 300 after the crystallization step is preferably 80% or more, more preferably 90% or more. When the crystallinity degree is in the above-mentioned range, absorption of light by the transparent electrode thin-film can be reduced, and a change in resistance value due to an environmental change is suppressed. The crystallinity degree is determined from the ratio of the area of crystal grains in the observation field in microscopic observation.

The resistivity of the transparent electrode thin-film 300 after the crystallization step is preferably $3.5 \times 10^{-4}$ Ωcm or less. The surface resistance of the transparent electrode thin-film 300 after the crystallization step is preferably 170 Ω/sq or less, more preferably 150 Ω/sq or less. When the transparent electrode thin-film has a low resistance, for example, the response speed of the capacitance touch panel can be improved, uniformity of the in-plane brightness in organic EL illumination can be improved, and power consumptions of various kinds of optical devices can be reduced.

The carrier density of the transparent electrode thin-film 300 after the crystallization step is preferably $4 \times 10^{20}$ cm$^{-3}$ to $9 \times 10^{20}$ cm$^{-3}$, more preferably $6 \times 10^{20}$ cm$^{-3}$ to $8 \times 10^{20}$ cm$^{-3}$. When the carrier density is in the above-mentioned range, the resistance of the transparent electrode thin-film 300 can be reduced.

As has been described above, in the substrate with transparent electrode according to the present invention, the two properties: "acceleration of crystallization in heat treatment" and "suppression of crystallization under a normal-temperature environment" can be achieved by making the underlayer dielectric and crystalline. As will be described later by showing examples, when the main component of the underlayer is indium oxide, crystallization of the transparent electrode thin-film under a normal-temperature environment can be further suppressed as compared to a case where an underlayer of other metal oxide (e.g., zinc oxide or yttrium oxide) is formed. When the main component of the underlayer is indium oxide, adhesion with electron materials that form a conductive paste etc. as described later, and optical materials that form an optical clear adhesive (OCA) etc. can be improved.

[Usages of Substrate with Transparent Electrode]

The substrate with transparent electrode according to the present invention can be used as a transparent electrode in a display a light-emitting element, a photoelectric conversion element or the like, and is suitably used as a transparent electrode for a touch panel. Particularly, the substrate with transparent electrode is preferably used in a capacitance touch panel because the transparent electrode thin-film has a low resistance.

In formation of a touch panel, a conductive ink or a paste is applied onto a substrate with transparent electrode, and heat-treated to form a collecting electrode as wiring for lead circuit. The heating method is not particularly limited, and examples thereof include using an oven, an IR heater or the like. The temperature and time for the heating treatment are appropriately set with consideration given to a temperature and time required for the conductive paste to de deposited on the transparent electrode. For example, the heating treatment is performed at 120 to 150° C. for 30 to 60 minutes in the case of heating by an oven, or at 150° C. for 5 minutes in the case of heating by an IR heater. The method for forming wiring for lead circuit is not limited to the above-mentioned method, and the wiring may be formed by a dry coating method. When wiring for lead circuit is formed by photolithography, the wiring can be thinned.

EXAMPLES

Hereinafter the present invention will be described more in detail by showing examples. The present invention is not limited to these examples.

For the thickness of each of an underlayer and a transparent electrode thin-film, a value determined by transmission electron microscope (TEM) observation of a cross-section of a substrate with transparent electrode was employed. The surface resistance of the transparent electrode thin-film was determined by four-point probe pressure contact measurement using Low Resistivity Meter Loresta GP (MCP-T710 manufactured by Mitsubishi Chemical Corporation). AFM measurement was performed in a measurement range of 1 micrometer square using NanoNavi II manufactured by Seiko Instruments Inc. The bias voltage in current image measurement was 1 V.

Example A1

An underlayer and a transparent electrode thin-film were continuously deposited on a transparent film base by the following method using a roll-to-roll sputtering apparatus.

(Deposition of Underlayer)

An underlayer was formed by a sputtering method on one surface of a 188 μm-thick PET film with a urethane-based resin hard coat layer formed on both surfaces. Using indium tin oxide (content of tin oxide: 10% by weight) target and introducing a mixed gas of oxygen and argon into the apparatus, the underlayer was deposited under the condition of an oxygen partial pressure of $1.0 \times 10^{-1}$ Pa, a deposition chamber pressure of 0.2 Pa, a substrate temperature of 0° C. and a power of 2 kW. The thickness of the underlayer was 3 nm.

(Deposition of Transparent Electrode Thin-Film)

A transparent electrode thin-film was formed on the underlayer to prepare a substrate with transparent electrode. Using indium tin oxide (content of tin oxide: 10% by weight) target and introducing a mixed gas of oxygen and argon into the apparatus, the underlayer was deposited under the condition of an oxygen partial pressure of $3.3 \times 10^{-2}$ Pa, a deposition chamber pressure of 0.2 Pa, a substrate temperature of 0° C. and a power of 12 kW. The thickness of the transparent electrode thin-film was 22 nm.

(Crystallization (Heat Treatment))

The substrate with transparent electrode was heat-treated at 150° C. for 1 hour. Microscopic observation showed that the substrate with transparent electrode was almost completely crystallized (crystallinity degree: 100%).

(Evaluation of Underlayer)

Another sample was prepared by depositing only an underlayer to measure the surface resistance and the resistivity was calculated to be $1.6 \times 10^2$ Ωcm. A shape of 1 μm square was measured using an AFM to confirm existence of crystal gains from the shape. From lattice image observation by TEM, a short-distance order of not less than 5 nm was confirmed.

(Evaluation of Crystallization at Normal Temperature)

The deposited film was left standing in a 25° C./50% RH environment for 1 week, and the sheet resistance at this tune was measured to evaluate crystallization at normal temperature. Crystallization was considered to progress when the sheet resistance decreased.

Example A2, Example A3, Comparative Example 1 and Comparative Example 3

Deposition and crystallization were performed in the same manner as in Example A1 except that the deposition conditions for the underlayer and the transparent electrode thin-film were changed as shown in Table 1. In Table 1, the n ITO (n=1, 3, 5, 7 and 10) means indium oxide containing n % by weight of tin oxide (the same applies to the following examples and comparative examples).

Example A4

In Example A4, a coating layer 400 was formed on a transparent film base 100 as shown in FIG. 3. The coating layer 400 was formed in the following manner. An acrylic resin (trade name: Dianal BR-102, manufactured by Mitsubishi Rayon Co., Ltd.) was dissolved in methyl cellosolve. The solid content was 30% by weight. To this resin solution, 1% by weight of zirconium oxide (trade name: Zirconia Powder TZ-3Y-E, manufactured by TOSOH CORPORATION) based on the amount of the acrylic resin was added, and the solution was sufficiently stirred to prepare a coating solution. The coating solution was applied to have a thickness of 3 μm by a bar coating method, and dried at 125° C. for 15 minutes to form a 1 μm-thick resin layer. In the same manner as in Example A1, an underlayer and a transparent electrode thin-film were deposited on the coating layer 400-formed surface of the transparent film base 100, followed by performing crystallization.

Example A5 and Comparative Example 4

A two-layered transparent electrode thin-film was formed as shown in FIG. 2. Deposition conditions for the underlayer and the transparent electrode thin-film are shown in Table 1. Except for this, the same procedure as in Example A1 was carried out to deposit and crystallize the underlayer and the transparent electrode thin-film.

Example B1, Example B2 Example B3 and Comparative Example 2

Deposition and crystallization were performed in the same manner as in Example A1 except that the type of the target and the deposition conditions in deposition of the underlayer and the transparent electrode thin-film were changed as shown in Table 1. As zinc oxide ($ZnO_{0.5}$), one having an oxygen ratio lower than that of stoichiometric zinc oxide (ZnO) was used. As yttrium oxide ($Y_2O_{2.5}$), one having an oxygen ratio lower than that of stoichiometric yttrium oxide ($Y_2O_3$) was used.

Comparative Example 5

An underlayer was not deposited, and a transparent electrode thin-film was formed on one surface of a PET film by a sputtering method. Except for this, the same procedure as in Example A1 was carried out to perform crystallization.

Configurations, deposition conditions and properties for the layers in examples and comparative examples are shown in Table 1. DC power supply was used for deposition of the underlayer 200 in Examples A1 to A5, Example B1, Comparative Example 1 and Comparative Examples 3 to 5, and AC power supply (MF power supply) was used for deposition of the underlayer 200 in Example B2, Example B3 and Comparative Example 2. DC power supply was used for deposition of the transparent electrode thin-film 300 in each example and comparative example.

Figure 7:
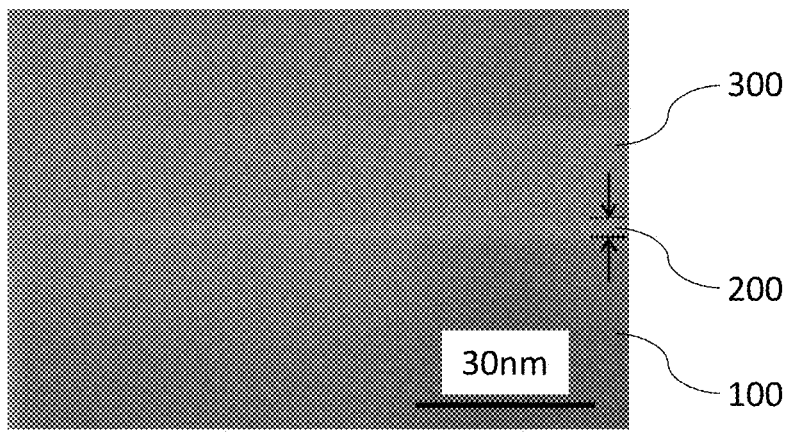
FIG. 7 is a cross-sectional TEM image of the substrate with transparent electrode in Example A1.
Figure 8:
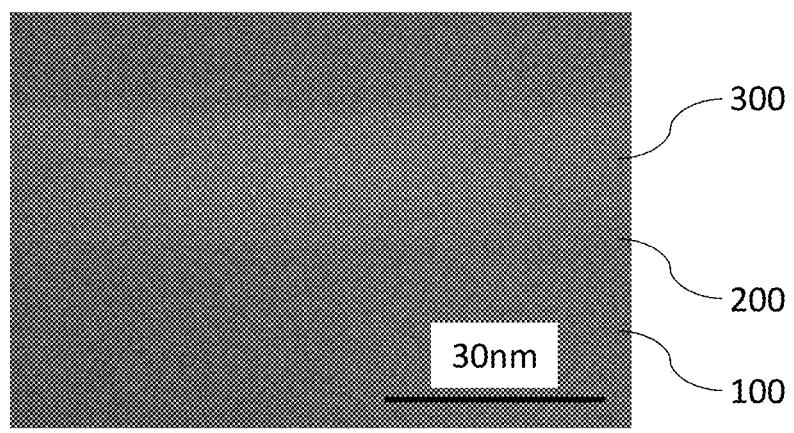
FIG. 8 is a cross-sectional image of a substrate with transparent electrode in Comparative Example 1.

FIG. 7 shows a transmission electron microscope (TEM) cross-section image of Example A1. The transparent electrode thin-film 300 is formed on the underlayer 200. From the contrast of the image, it can be determined that the underlayer 200 in Example A1 is crystalline. FIG. 8 shows a transmission electron microscope (TEM) cross-section image of Comparative Example 1. There is not a contrast of the image in the vicinity of the interface between the underlayer 200 and the transparent electrode thin-film 300, and therefore it can be determined that the underlayer 200 in Comparative Example 1 is amorphous.

TABLE 1

| | | | gas (sccm) | | pressure (Pa) | | power (kW) | thickness (nm) | crystallinity before heating | underlayer resistivity (Ω cm) | sheet resistance (Ω/sq) | | | $R_0 - R_2$ | coating layer |
|---|---|---|---|---|---|---|---|---|---|---|---|---|---|---|---|
| | | target | argon | oxygen | oxygen partial pressure | whole pressure | | | | | $R_0$ | $R_1$ | $R_2$ | | |
| Example A1 | underlayer | 10 ITO | 100 | 100 | 0.100 | 0.2 | 2 | 3 | crystalline | 160 | | | | | absent |
| | conductive layer | 10 ITO | 100 | 20 | 0.033 | 0.2 | 12 | 22 | amorphous | | 280 | 85 | 270 | 10 | |
| Example A2 | underlayer | 7 ITO | 100 | 120 | 0.109 | 0.2 | 2 | 3 | crystalline | 210 | | | | | absent |
| | conductive layer | 7 ITO | 100 | 20 | 0.033 | 0.2 | 12 | 22 | amorphous | | 300 | 105 | 285 | 15 | |
| Example A3 | underlayer | 5 ITO | 100 | 150 | 0.120 | 0.2 | 2 | 3 | crystalline | 300 | | | | | absent |
| | conductive layer | 5 ITO | 100 | 20 | 0.033 | 0.2 | 12 | 22 | amorphous | | 350 | 135 | 335 | 15 | |
| Example A4 | underlayer | 10 ITO | 100 | 100 | 0.120 | 0.2 | 2 | 3 | crystalline | 160 | | | | | present |
| | conductive layer | 10 ITO | 100 | 20 | 0.033 | 0.2 | 12 | 22 | amorphous | | 275 | 90 | 265 | 10 | |

TABLE 1-continued

| | | target | gas (sccm) argon | gas (sccm) oxygen | pressure (Pa) oxygen partial pressure | pressure (Pa) whole pressure | power (kW) | thickness (nm) | crystallinity before heating | underlayer resistivity (Ω cm) | sheet resistance (Ω/sq) $R_0$ | sheet resistance (Ω/sq) $R_1$ | sheet resistance (Ω/sq) $R_2$ | $R_0 - R_2$ | coating layer |
|---|---|---|---|---|---|---|---|---|---|---|---|---|---|---|---|
| Example A5 | underlayer | ITO | 5 | 100 | 100 | 0.100 | 0.2 | 2 | 3 | crystalline | 300 | | | | | absent |
| | conductive layer | ITO | 10 | 100 | 20 | 0.033 | 0.2 | 11 | 19 | amorphous | | | | | | |
| | conductive layer | ITO | 1 | 100 | 20 | 0.033 | 0.2 | 2 | 3 | amorphous | | 320 | 140 | 305 | 15 | |
| Example B1 | underlayer | ZnO | 100 | 200 | 0.133 | 0.2 | 2 | 3 | crystalline | 1240 | | | | | absent |
| | conductive layer | ITO | 5 | 100 | 20 | 0.033 | 0.2 | 12 | 22 | amorphous | | 400 | 142 | 360 | 40 | |
| Example B2 | underlayer | $Y_2O_3$ | 100 | 150 | 0.120 | 0.2 | 2 | 3 | crystalline | 3200 | | | | | absent |
| | conductive layer | ITO | 10 | 100 | 20 | 0.033 | 0.2 | 12 | 22 | amorphous | | 290 | 90 | 275 | 15 | |
| Example B3 | underlayer | $Y_2O_3$ | 100 | 150 | 0.120 | 0.2 | 2 | 3 | crystalline | 3200 | | | | | absent |
| | conductive layer | ITO | 5 | 100 | 20 | 0.033 | 0.2 | 12 | 22 | amorphous | | 350 | 115 | 315 | 35 | |
| Comparative Example 1 | underlayer | ITO | 10 | 100 | 15 | 0.026 | 0.2 | 2 | 3 | amorphous | $3 \times 10^4$ | | | | | absent |
| | conductive layer | ITO | 10 | 100 | 20 | 0.033 | 0.2 | 12 | 22 | amorphous | | 340 | 240 | 280 | 60 | |
| Comparative Example 2 | underlayer | $SiO_2$ | 100 | 100 | 0.150 | 0.3 | 7 | 3 | amorphous | 4000 | | | | | absent |
| | conductive layer | ITO | 10 | 100 | 20 | 0.033 | 0.2 | 12 | 22 | amorphous | | 320 | 85 | 120 | 200 | |
| Comparative Example 3 | underlayer | ITO | 10 | 100 | 100 | 0.100 | 0.2 | 5 | 10 | amorphous | 1.2 | | | | | absent |
| | conductive layer | ITO | 10 | 100 | 20 | 0.033 | 0.2 | 12 | 22 | amorphous | | 290 | 90 | 105 | 185 | |
| Comparative Example 4 | underlayer | ITO | 3 | 100 | 25 | 0.080 | 0.4 | 2 | 3 | amorphous | $4 \times 10^4$ | | | | | absent |
| | conductive layer | ITO | 10 | 100 | 25 | 0.080 | 0.4 | 15 | 19 | amorphous | | | | | | |
| | conductive layer | ITO | 3 | 100 | 25 | 0.080 | 0.4 | 2 | 3 | amorphous | | 300 | 130 | 175 | 125 | |
| Comparative Example 5 | conductive layer | ITO | 10 | 100 | 20 | 0.033 | 0.2 | 12 | 22 | amorphous | | 360 | 260 | 330 | 30 | absent |

Notes:
$R_0$: sheet resistance after deposition
$R_1$ sheet resistance after heating
$R_2$ sheet resistance after crystallization at normal temperature From the results of examples shown in Table 1, it has been confirmed that when the underlayer is dielectric and crystalline, both of reduction of the resistance after heat treatment and suppression of crystallization at normal temperature can be achieved. Particularly, in Examples A1 to A5 where the main component of the underlayer is indium oxide, the effect of suppressing crystallization at normal temperature can be improved as compared to Examples B1 to B3 where the main component of underlayer is zinc oxide or yttrium oxide.

From Table 1, it is considered that when the underlayer is deposited at a low power, mixing and damage to the transparent film that may be caused by plasma can be suppressed, whereby ingress of crystallization inhibiting substances into the transparent electrode thin-film can be prevented, and activation energy can be controlled to promote crystal nuclei growth.

It is also apparent that when the underlayer is deposited at a high oxygen partial pressure, a dielectric indium oxide thin-film can be formed. However, as in Comparative Example 3, it is unable to make the underlayer dielectric depending on a thickness or deposition power even when the oxygen partial pressure in deposition of the underlayer is high.

Thus, in Examples, crystallization at normal temperature did not occur while the sheet resistance after heat treatment decreased, so that a satisfactory substrate with transparent electrode was prepared. On the other hand, in Comparative Examples, the sheet resistance after heat treatment decreased, but crystallization at normal temperature was not suppressed; or crystallization at normal temperature did not occur, but the sheet resistance was not decreased by heat treatment.

DESCRIPTION OF REFERENCE CHARACTERS

100: transparent film base (film substrate)
200: dielectric underlayer (underlayer)
300: transparent electrode thin-film
400: coating layer

The invention claimed is:

1. A substrate with transparent electrode in which a transparent electrode thin-film formed of a transparent conductive oxide is formed on a film substrate, wherein
   an underlayer containing zinc oxide as a main component is formed between the film substrate and the transparent electrode thin-film,
   the underlayer is in contact with the transparent electrode thin-film,
   the transparent electrode thin-film is amorphous,
   the underlayer is dielectric and crystalline and has a thickness of 2 to 15 nm, and a cerium oxide content of the underlayer is 1% by weight or less.

2. The substrate with transparent electrode according to claim 1, wherein the transparent electrode thin-film contains indium oxide as a main component.

3. The substrate with transparent electrode according to claim 1, wherein a thickness of the underlayer is 2 to 5 nm.

4. The substrate with transparent electrode according to claim 1, wherein a thickness of the transparent electrode thin-film is 15 to 30 nm.

5. The substrate with transparent electrode according to claim 1, wherein a silicon oxide content of the underlayer is 1% by weigh or less.

6. A substrate with transparent electrode in which a transparent electrode thin-film formed of a transparent conductive oxide is formed on a film substrate, wherein an underlayer containing yttrium oxide as a main component is formed between the film substrate and the transparent electrode thin-film, the underlayer is in contact with the transparent electrode thin-film, the transparent electrode thin-film is amorphous, the underlayer is dielectric and crystalline and has a thickness of 2 to 15 nm, and a cerium oxide content of the underlayer is 1% by weight or less.

7. The substrate with transparent electrode according to claim 6, wherein the transparent electrode thin-film contains indium oxide as a main component.

8. The substrate with transparent electrode according to claim 6, wherein a thickness of the underlayer is 2 to 5 nm.

9. The substrate with transparent electrode according to claim 6, wherein a thickness of the transparent electrode thin-film is 15 to 30 nm.

10. The substrate with transparent electrode according to claim 6, wherein a silicon oxide content of the underlayer is 1% by weight or less.

* * * * *